US008589138B2

(12) United States Patent
McConaghy et al.

(10) Patent No.: US 8,589,138 B2
(45) Date of Patent: Nov. 19, 2013

(54) ON-THE-FLY IMPROVEMENT OF CERTAINTY OF STATISTICAL ESTIMATES IN STATISTICAL DESIGN, WITH CORRESPONDING VISUAL FEEDBACK

(75) Inventors: Trent Lorne McConaghy, Beatty (CA); Charles Cazabon, Regina (CA); Kristopher Breen, Saskatoon (CA); Amit Gupta, Edmonton (CA); Jeffrey Dyck, Saskatoon (CA); Jiandong Ge, Saskatoon (CA); David Callele, Saskatoon (CA); Shawn Rusaw, Saskatoon (CA); Joel Cooper, Saskatoon (CA); Anthony Arkles, Saskatoon (CA); Samer Sallam, Saskatoon (CA); Jason Coutu, Saskatoon (CA)

(73) Assignee: Solido Design Automation Inc., Saskatoon, Saskatchewan (CA)

( * ) Notice: Subject to any disclaimer, the term of this patent is extended or adjusted under 35 U.S.C. 154(b) by 839 days.

(21) Appl. No.: 12/131,294

(22) Filed: Jun. 2, 2008

(65) Prior Publication Data
US 2008/0300847 A1 Dec. 4, 2008

Related U.S. Application Data

(60) Provisional application No. 60/941,410, filed on Jun. 1, 2007.

(51) Int. Cl.
*G06F 17/50* (2006.01)
(52) U.S. Cl.
USPC .......................................... 703/14; 716/132
(58) Field of Classification Search
None
See application file for complete search history.

(56) References Cited

U.S. PATENT DOCUMENTS

| 5,418,974 A * | 5/1995 | Craft et al. ..................... 716/111 |
| 7,458,049 B1 * | 11/2008 | Tuncer et al. ................. 716/113 |
| 7,676,351 B2 * | 3/2010 | Jandhyala et al. ................ 703/2 |
| 2005/0257178 A1 * | 11/2005 | Daems et al. ..................... 716/2 |

OTHER PUBLICATIONS

Cox et al. "Statistical Modeling for Efficient Parametric Yield Estimation of MOS VLSI Circuits", Feb. 1985, IEEE Journal of Solid-State Circuits, vol. SC-20, No. 1, pp. 391-398.*
Yu et al. "Statistical Performance Modeling and Parametric Yield Estimation of MOS VLSI", Nov. 1987, IEEE Transactions of Computer-Aided Design, vol. CAD-6, No. 6, pp. 1013-1022.*
Zhang, Lizheng. "Statistical Timing Analysis for Digital Circuit Design", Dec. 2005, Thesis, 121 pages.*
Silvaco International, "VMF Interactive Tools User's Manual, Volumn I", Nov. 1998, 256 pages.*
Cadence, "PSpice USer's Guide", May 31, 2000, 610 pages.*

* cited by examiner

*Primary Examiner* — Suzanne Lo
(74) *Attorney, Agent, or Firm* — Louis B. Allard; Borden Ladner Gervais LLP

(57) ABSTRACT

A system and method to analyze analog, mixed-signal, and custom digital circuits. The system and method displays to a user characteristic values of a circuit and statistical uncertainty values of the characteristic values early in a sampling or characterization run of the circuit. The characteristic values and their statistical uncertainties are updated as the sampling or characterization run progresses. The user can halt the sampling or characterization run once a desired level of uncertainty is attained. The system can automatically halt the sampling or characterization run, once the statistical uncertainty lie within a pre-determined range.

9 Claims, 9 Drawing Sheets

ON-THE-FLY IMPROVEMENT OF CERTAINTY OF STATISTICAL ESTIMATES IN STATISTICAL DESIGN, WITH CORRESPONDING VISUAL FEEDBACK

CROSS REFERENCE TO RELATED APPLICATIONS

This application claims the benefit of priority of U.S. Provisional Patent Application No. 60/941,410 filed Jun. 1, 2007, which is incorporated herein by reference in its entirety. The applicant acknowledges the participation of K.U. Leuven Research and Development in the development of this invention.

FIELD OF THE INVENTION

The present invention relates generally to analog, mixed-signal, and custom digital circuit design tools. More particularly, the present invention relates to tools for statistical sampling and characterization of such circuits.

BACKGROUND OF THE INVENTION

Software tools are frequently used in the design of analog, mixed-signal and custom digital circuits. In front-end design-for-yield, designers must choose device sizes such that the maximum possible percentage of manufactured chips meet all specifications (i.e., the designers aim at maximizing yield). In order to effectively design such circuits, designers need insights into the design that are not necessarily apparent from the circuit schematic alone. Designers tend to receive added insights into the circuit design by viewing visual representations of the circuit topology, as a "schematic". Currently, there are schematic editors/viewers for viewing circuit schematics. There are also tools for circuit sampling and characterization, with corresponding visualizations.

Sampling tools report information such as, amongst others, yield estimate for a given design point, histograms for each performance metric, two-dimensional (2D) and three-dimensional (3D) scatter plots, where variables can include performance metrics, design variables, environmental variables, and process variables.

Characterization tools provide further information, such as, for example, relative impact of design variables on yield, relative impact of design variables on a given performance metric, relative impact of all design variables vs. all process variables vs. all environmental variables, tradeoffs of yield vs. performances, yield value for a sweep of a design variable, etc. This type of information has value in terms of: (a) verifying hypotheses about the electrical circuit; (b) aiding intuition; (c) uncovering new knowledge; and (d) providing new perspectives leading to fresh thinking. For circuit design this translates to more effective designers, higher yield, better performing designs, and faster time-to-market.

Such sampling and characterization tools typically involve steps of: (1) gathering circuit simulation data (e.g., from Simulation Programs with Integrated Circuit Emphasis—SPICE); (2) processing the circuit simulation data (e.g. by doing statistical calculations, data-mining/model-building, etc.); and (3) presenting raw processed results to a user (e.g., through a visual display).

While such sampling and characterization tools have great benefit, they also have drawbacks. First, there is a time lag of hours (or even days) between the user starting a sampling/characterization run and seeing the final results. This is due to the time it takes to do a sufficient number of circuit simulations and, for example, in the case of a characterization run, to build sufficiently accurate data-mining models that can be presented. A further drawback is that it can be difficult to predict how much runtime is needed in order to get a desired quality of information. An additional drawback is that if the initial setup of the sampling/characterization run has been done improperly, such that a whole re-run is needed, the user does not find out until the run is over, which leads to considerable lost time. Furthermore, the final results obtained by sampling/characterization run have some related uncertainty simply because the models have to work with a limited amount of data. However, current sampling and characterization tools are not adapted to display uncertainties. This can have unfortunate consequences, for example in the case of reporting the relative impact on yield of an electrical circuit variable. If just the expected impact is shown, then the user may perceive false positives or false negatives. That is, variables that shouldn't have any impact are shown has having some, and variables that should have impact appear to have none.

Therefore, if is desirable to provide a method and system that allows to statistically evaluate, analyze and/or optimize an electrical circuit design (ECD) by determining characteristic values of the ECD and by determining a statistical uncertainty of the characteristic values.

Further, it is desirable to display to the user the characteristic values of the ECD and the statistical uncertainty of the characteristic values, and to update the characteristic values of the ECD and the statistical uncertainty of the characteristic values, as the statistical evaluation of the ECD is taking place.

SUMMARY OF THE INVENTION

It is an object of the present invention to obviate or mitigate at least one disadvantage of previous sampling and characterization tools used in analog, mixed-signal or custom digital circuit design.

In a first aspect of the invention there is provided a method to analyze an electrical circuit design (ECD). The method comprises steps of: (a) obtaining simulation data for multiple candidate designs of the ECD, the ECD having associated therewith at least one of circuit variables and circuit performance metrics; (b) processing the simulation data in accordance with pre-determined rules to obtain characteristic data of the ECD and to determine a characteristic value of the ECD, the characteristic value of the ECD depending on the at least one of circuit variables and circuit performance metrics; (c) processing the characteristic data of ECD to determine a statistical uncertainty of the characteristic value; (d) determining if the statistical uncertainty of the characteristic value is outside a pre-determined range; and, (e) only if the statistical uncertainty of the characteristic value is outside the pre-determined range, obtaining further simulation data for further candidate designs of the ECD to add to the simulation data and repeating steps (b) through (d).

In a further embodiment, obtaining simulation data for multiple candidate designs of the ECD can include simulating multiple candidate designs of the ECD; and obtaining further simulation data of multiple candidate designs of the ECD can include further simulating multiple candidate designs of the ECD.

In a further embodiment, obtaining simulation data for multiple candidate designs the ECD can include accessing a database containing the simulation data to extract the simulation data from the database; and obtaining further simulation data for multiple candidate designs of the ECD can include further accessing the database containing the simulation data to further extract simulation data from the database.

In a further embodiment, the method can further comprise a step of displaying to a user the characteristic value and the statistical uncertainty of the characteristic value to allow the user to assess a quality of the ECD, and the step of displaying can be performed following step (c).

In a further embodiment, the method can comprise a step of displaying to a user the characteristic value and the statistical uncertainty of the characteristic value; and a step of the user interrupting steps (a) through (e) upon the characteristic value meeting a pre-determined criteria. The step of displaying can include displaying the characteristic value and the statistical uncertainty of the characteristic value in a graphical format.

In a further embodiment of the method, the statistical uncertainty value can be one of a confidence interval and a statistical p-value.

In a further embodiment, the circuit variables can include at least one of design variables of the ECD, environmental variables of the ECD and process variables of the ECD.

In a further embodiment, the circuit performance metrics can include at least a manufacturing yield of the ECD.

In a further embodiment, the step of simulating the ECD can include performing a SPICE simulation of the ECD to obtain SPICE-data and the step of processing the characteristic data of the ECD can include at least one of performing a sampling run of the SPICE-data and performing a characterization run of the SPICE-data.

In further embodiments, the pre-determined rules can include one or more of a pre-determined data-mining algorithm, a pre-determined model-building algorithm, and a pre-determined statistical algorithm.

In a second aspect, there is provided a method to analyze an electrical circuit design (ECD). The method comprises steps of: (a) obtaining simulation data for multiple candidate designs of the ECD, the ECD having associated therewith at least one of circuit variables and circuit performance metrics; (b) processing the simulation data in accordance with pre-determined rules to obtain characteristic data of the ECD and to determine a characteristic value of the ECD, the characteristic value of the ECD depending on the at least one of circuit variables and circuit performance metrics; (c) processing the characteristic data of ECD to determine a statistical uncertainty of the characteristic value; (d) displaying to a user at least the statistical uncertainty of the characteristic value; (e) the user determining if the statistical uncertainty of the characteristic value meets a pre-determined criteria; (f) if the statistical uncertainty value meets the pre-determined criteria, the user interrupting the method, otherwise, if the statistical uncertainty fails to meet the pre-determined criteria, obtaining further simulation data for further candidate designs of the ECD to add to the simulation data and repeating steps (b) through (e).

In a third aspect of the invention there is provided a system to analyze an electrical circuit design (ECD). The system comprises an ECD simulation module to simulate the ECD to obtain simulation data for multiple candidate designs of the ECD, the ECD having associated therewith at least one of circuit variables and circuit performance metrics. The system also comprises a database in communication with the ECD simulation module, the database to store the simulation data of the ECD; a processor module in communication with the database to extract at least a portion of the simulation data of the ECD from the database to calculate a characteristic value of the ECD and to calculate a statistical uncertainty of the characteristic value of the ECD; and a comparator module in communication with the processor module to receive the statistical uncertainty value from the processor module and to compare the statistical uncertainty of the characteristic value with a pre-determined value range.

In a further embodiment, the system can comprise an input module of ECD particulars, the input module being in communication with the ECD simulation module, the ECD particulars including at least one of a netlist, design variables, environmental variables and random variables of the ECD.

In a further embodiment, the system is such that the statistical uncertainty of the characteristic value is one of a confidence interval and a p-value.

In a further embodiment, the system can comprise a display system in communication with the processor module to receive the characteristic value and the statistical uncertainty of the characteristic value and to display to a user in real-time, in a format including at least one of a text format and a graph format, the characteristic value and the statistical uncertainty of the characteristic value.

In a further embodiment, the system can comprise a user input module in communication with the processor module, the user input module to receive a command from the user to halt processing by the processor module.

In a fourth aspect, there is provided a system to analyze an electrical circuit design (ECD). The system comprises: an ECD simulation module to simulate the ECD to obtain simulation data for multiple candidate designs of the ECD, the ECD having associated therewith at least one of circuit variables and circuit performance metrics; a database in communication with the ECD simulation module, the database to store the simulation data of the ECD; and a processor module in communication with the database to extract at least a portion of the simulation data of the ECD from the database to calculate a characteristic value of the ECD and to calculate a statistical uncertainty of the characteristic value of the ECD. The system further comprises a display system in communication with the processor module to receive the characteristic value and the statistical uncertainty of the characteristic value and to display to a user in real-time, in a format including at least one of a text format and a graphical format, the characteristic value and the statistical uncertainty of the characteristic value; and a user input module in communication with the processor module, the user input module to receive a command from the user to halt processing by the processor module upon the user determining that the statistical uncertainty value meets a pre-determined criteria.

In a fifth aspect of the invention there is provided a computer readable memory having recorded thereon statements and instructions for execution by a computer to carry out a method to analyze an electrical circuit design (ECD), the method comprising steps of: (a) obtaining simulation data for multiple candidate designs of the ECD, the ECD having associated therewith at least one of circuit variables and circuit performance metrics; (b) processing the simulation data in accordance with pre-determined rules to obtain characteristic data of the ECD and to determine a characteristic value of the ECD, the characteristic value of the ECD depending on the at least one of circuit variables and circuit performance metrics; (c) processing the characteristic data of ECD to determine a statistical uncertainty of the characteristic value; (d) determining if the statistical uncertainty of the characteristic value is outside a pre-determined range; and, (e) only if the statistical uncertainty of the characteristic value is outside the pre-determined range, obtaining further simulation data for further candidate designs of the ECD to add to the simulation data and repeating steps (b) through (d).

In a sixth aspect of the invention, there is provided a computer readable memory having recorded thereon statements and instructions for execution by a computer to carry out a method to analyze an electrical circuit design (ECD), the method comprising steps of: (a) obtaining simulation data for multiple candidate designs of the ECD, the ECD having associated therewith at least one of circuit variables and circuit performance metrics; (b) processing the simulation data in accordance with pre-determined rules to obtain characteristic data of the ECD and to determine a characteristic value of the ECD, the characteristic value of the ECD depending on the at least one of circuit variables and circuit performance metrics; (c) processing the characteristic data of ECD to determine a statistical uncertainty of the characteristic value; (d) displaying to a user at least the statistical uncertainty of the characteristic value; (e) the user determining if the statistical uncertainty of the characteristic value meets a pre-determined criteria; and (f) if the statistical uncertainty value meets the pre-determined criteria, the user interrupting the method, otherwise, if the statistical uncertainty fails to meet the pre-determined criteria, obtaining further simulation data for further candidate designs of the ECD to add to the simulation data and repeating steps (b) through (e).

According to various embodiments, the present invention provides a means to present results very early in a sampling or characterization run, and continually improve them over time. Furthermore, there is a means to report the quality or uncertainty of the current results, which therefore improves over time too. Dynamic improvement of certainty over time provides a payoff that is far higher than the sum of its parts.

One reference example of showing uncertainty over time is to show scatter plot data, which "fills in" dynamically over time. Another reference example is to show confidence intervals (upper and lower bound for a given estimator), which tighten up over time. The run terminates when the user commands the tool to terminate, or according to some termination criteria (e.g. a maximum runtime is hit, or a target confidence interval is hit).

Confidence intervals can be a means of reporting uncertainty. This includes: upper and lower bounds for the overall yield estimate at a given design point; upper and lower bounds for each variable's relative impact on yield or a performance metric; and for a sweep of a design variable vs. yield, the upper and lower bounds of yield for each value of that design variable. The confidence intervals can be reported graphically and/or with text. Confidence intervals might be presented according to particular target such as 95% confidence, or possible plotted as a "blurry" fade-out which will give the user a more intuitive feel about the uncertainty about the knowledge. As an alternative to confidence intervals, other means of reporting uncertainty can be used, such as, for example, a statistical p-value.

A variation of the above flow is to use information from previous sampling or characterization run(s) as inputs.

There are multiple benefits in giving runtime feedback of uncertainty to the user. First, by giving "rough" information early, the user can verify if the initial setup has been done properly; and if it has not, then the user can stop the run and re-configure the setup. This includes the raw data, which at first will just be one or a few simulations, but will become plentiful as time passes. Second, during the course of the run, the user will know how certain the current results are, and may decide that he has enough information to stop, stopping much earlier than the previous one-shot style approach. This certainty can come intuitively in the form of a visual inspection, or via further calculations such as confidence intervals. Also, the user will gain an understanding of the information gain over time (e.g. rate of fill of a scatter-plot; or convergence of confidence interval width), so he can decide how much longer he is willing to wait based on the expected information payoff. Finally, at any point in the run, and once the run terminates, he will know exactly how good the information is (e.g., because he knows the lower and upper bound for a statistical estimate). This will reduce the chance of jumping to false conclusions (e.g., about false positives and negatives for relative impacts of variables).

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system to simulate analog, mixed-signal, and custom digital circuits. The system and method statistically calculates characteristic values of the circuit and statistical uncertainty values of the characteristic values. The system and method can automatically halt the calculations once the statistical uncertainty vales lie within pre-determined ranges. The system can display to a user the characteristic values and their statistical uncertainty values, which can be updated as calculations progress. The user can halt the calculations once he determines that a desired level of uncertainty has been attained be the calculations, i.e., once the user determines that a pre-determined criteria has been met.

Figure 1:
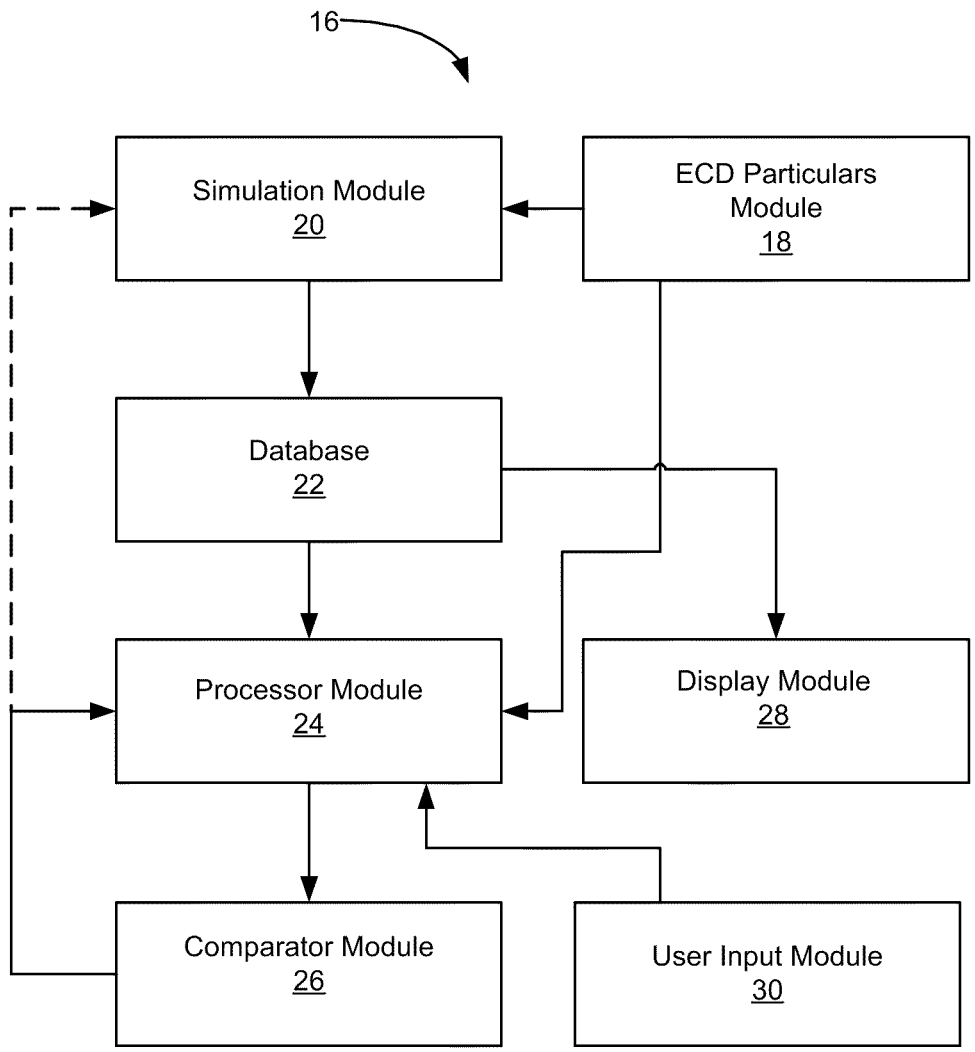
FIG. 1 shows an embodiment of the system of the present invention.

FIG. 1 shows an exemplary embodiment of a system 16 of the present invention that can statistically evaluate, analyze and optimize an ECD. The analysis, statistical evaluations and optimization of a given ECD that are to be performed by the system 16 are defined by an ECD particulars module 18, which includes a netlist of the ECD, performance metrics, design variables, process variables and environmental variables of the ECD. The ECD particulars module 18 also defines the steps to be followed to measure the performance metrics as a function of the ECD's several variables. The ECD particulars module 18 is in fact where the problem to be studied by the system 16 is setup.

The performance metrics can be a function of these various variables. The design variables can include, e.g., widths and lengths of devices of the ECD. The process variables can be related to random variations in the ECD manufacturing. The environmental variables can include, for example, temperature, load conditions and power supply. The ECD particulars module 18 can also include further information about design variables, such as minimum and maximum values; environmental variables, such as a set of environmental points to be used as "corners" with which to simulate the ECD; and random variables, which can be in the form of a probability density function from which random sample values can be drawn.

As will be understood by the skilled worker, the procedure to be followed to measure the performance metrics can be in the form of circuit testbenches that are combined with the netlist to form an ultimate netlist. The ultimate netlist can be simulated by a simulation module 20, which is in communication with the ECD particulars module 18. The simulation module 20 can include, for example, one or more circuit simulators such as, for example, SPICE simulators. The simulation module 20 calculates waveforms for a plurality of candidate designs of the ECD. The waveforms are then processed to determine characteristic values of the ECD. As will be understood by the skilled worker, the plurality of candidate designs is a series of ECD differing slightly from each other in the value of one or more of their variables.

The problem setup, as defined by the ECD particulars module 18, is acquired by the simulation module 20, which uses one or more simulators to simulate data for multiple candidate designs of the ECD. The simulation data is stored in a database 22 from where it can be accessed by a processor module 24, which can include, for example, a sampler or a characterizer. The processor module 24 is also in communication with the ECD particulars module 18. Given the problem setup (defined by the ECD particulars module 18), the sampler and/or characterizer can perform "sampling" and/or "characterization" respectively, of the ECD in question, by processing the simulation data, to produce characteristic data of the ECD. Based on this characteristic data, the processor module 24 can calculate one or more characteristic values of the ECD. During the course of a sampling or characterization, the database 22 can be populated with the characteristic data provided by the processor module 24 and with the one or more characteristic value of the ECD.

Characteristic values can include, for example, a yield estimate for a given design point, histograms for each performance metric, 2D and 3D scatter plots with variables that include performance metrics, design variables, environmental variables, and process variables. A characteristic value can also represent, amongst others, the relative impact of design variables on yield, the relative impact of design variables on a given performance metric, the relative impact of all design variables vs. all process variables vs. all environmental variables, tradeoffs of yield vs. performances, and yield value for a sweep of a design variable.

In addition to being able to sample and/or characterize the ECD defined by the ECD particulars module 18, the processor module 24 also includes statistical uncertainty functions that calculate the statistical uncertainty of the one or more characteristic values defined by the characteristic data and that can store the statistical uncertainty data in the database 22. The statistical uncertainty functions can include, for example, a confidence interval function and a statistical p-value function, which are well known in the field statistics.

As an example, based on simulation data for a plurality of candidate designs of an ECD stored in the database 22, the processor module 24 can calculate the manufacturing yield of a plurality of candidate designs of the ECD and store each manufacturing yield of each candidate design in the database 22. In this example, the characteristic data is the set of manufacturing yields. Further, the processor module 24 can calculate, for example, an average manufacturing yield based on the set of manufacturing yield. In this example, the average manufacturing yield is the characteristic value of the ECD. Finally, the processor module 24 can calculate a statistical uncertainty on the average manufacturing yield based on the set of manufacturing yields. As will be understood by the skilled worker, the statistical uncertainty can be calculated, for example, by using confidence bounds calculations on the binomial distribution.

A display module 28 is in communication with the database 22 and can access the data stored therein. That is, the display module 28 can display to the user the one or more characteristic values and the statistical uncertainty of each of the one or more characteristic values. The display module 28 can also be in communication with the processor module 24 to receive data to display directly from the processor module 24.

The exemplary system 16 comprises a comparator module 26, which includes pre-determined target ranges for the statistical uncertainty values of the characteristic values calculated by the processor module 24. These pre-determined target ranges identify the accuracy that should be attained by the statistical uncertainty values in order for the statistical evaluation of the ECD defined in the ECD particulars module 18 to be deemed successful. Once the statistical uncertainty values fall within the pre-determined ranges, the comparator module sends an "END" command to the processor module 24 to stop processing. The comparator module can also signal the simulation module 20 to stop.

The system 16 also includes a user input module 30, which allows the user to interrupt the processor module 24 upon the user looking at the displayed characteristic values and statistical uncertainty values and determining that the displayed information is adequate and that no further processing is required. That is, the user can look at the displayed information and assess if the characteristic values and their statistical uncertainty value meet a pre-determined criteria. The user can also determine, by looking at the displayed information if there is an error in the problem setup and halt processing in order to address the error in question. The user input module 30 can also be in communication with the simulation module 20 in order to stop any further action of the simulation module 20.

Thus, the pre-determined criteria can be akin to the pre-determined target range used in the comparator module 26; however, it can also be related to any other suitable measure related to the characteristic values or to the statistical uncertainties of the characteristic values. For example, the rate of change of the statistical uncertainties as a function of processing time can be used as such a criteria. This change can be calculated by the processor module 24 and displayed by the display module 28. In this example, the pre-determined criteria can be a minimum variation in the statistical uncertainty. If the displayed change in statistical uncertainty falls below the pre-determined minimum variation, the user signals, through the user input module 30, the processor module 24 to stop processing.

As will be understood by the skilled worker, the comparator module 26 and the user input module 30 need not both be present in the system 16.

Figure 2:
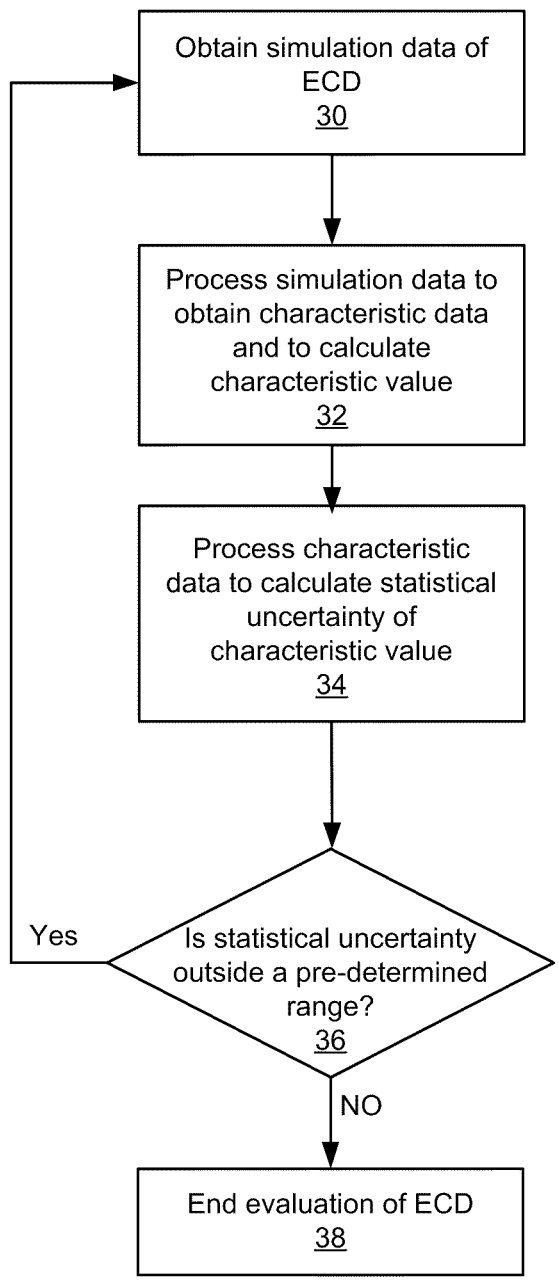
FIG. 2 shows an embodiment of a method of the present invention.

FIG. 2 shows an exemplary method of the present invention. At step 30, simulation data is obtained and is processed at step 32 to obtain characteristic data of the ECD and to calculate the characteristic values of the ECD. At step 34, the characteristic data used in calculating the characteristic values is processed to obtain the statistical uncertainties of the characteristic values. At step 38, the statistical uncertainty values are compared to pre-determined ranges. It the uncertainty values are outside the pre-determined ranges, the method loops back to step 30 where additional simulation data is obtained and the steps 32 to 36 are repeated. The method ends at step 38 upon the statistical uncertainty values being within the pre-determined ranges. The exemplary method of FIG. 2 can also have a runtime limit and/or a maximum number of simulations limit that will stop any further processing upon being reached. Further, the method can have a user stop request step that will also halt any further processing of data.

The processor module 24 of FIG. 1 can output many types of characteristic values of an ECD and their related statistical uncertainty values. The following describes how statistical uncertainties expressed as confidence intervals can be used.

Figure 3:
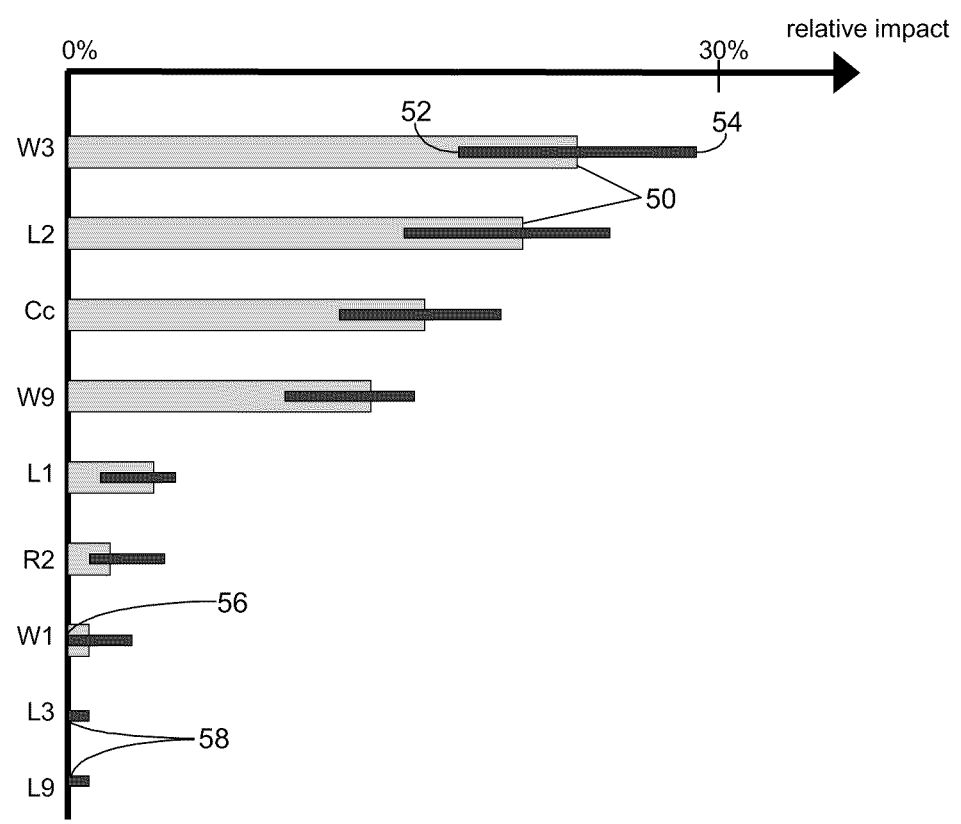
FIG. 3 shows an exemplary use of confidence intervals in reporting relative impacts.

One type of characteristic values that the processor module 24 can compute is the relative importance among certain variables (e.g. among design variables, or among all variables) on an ECD. Relative importance can be based on calculations as simple as sensitivity analysis (taking absolute values), or more complex approaches such as the average variation in a performance metric that one variable causes throughout its whole range, compared to average variations of other variables. It is possible for such impact (importance) data calculated to have uncertainties, because there are a limited number of simulations from which the relative importance can be extracted. A current problem for users is that if only the relative impacts are reported without any uncertainty information, the user will perceive some variables with known-nonzero impact to be accidentally missed (false negatives), and other variables with known-zero impact to be included (false positives). However, if uncertainty is reported to the user, then the user has better grasp of the situation. FIG. 3 shows the use of confidence intervals to give the user insight about the uncertainty of the relative impacts of length variables L1, L2, L3, L9; of width variables W1, W3, W9, of resistor value R2 and of a capacitor variable Cc of an ECD. At FIG. 3, estimates of relative impacts 50 are shown with their corresponding lower confidence bound 52 and upper confidence bound 54. FIG. 3 also shows a possible false positive 56 and possible false negatives 58.

Figure 4:
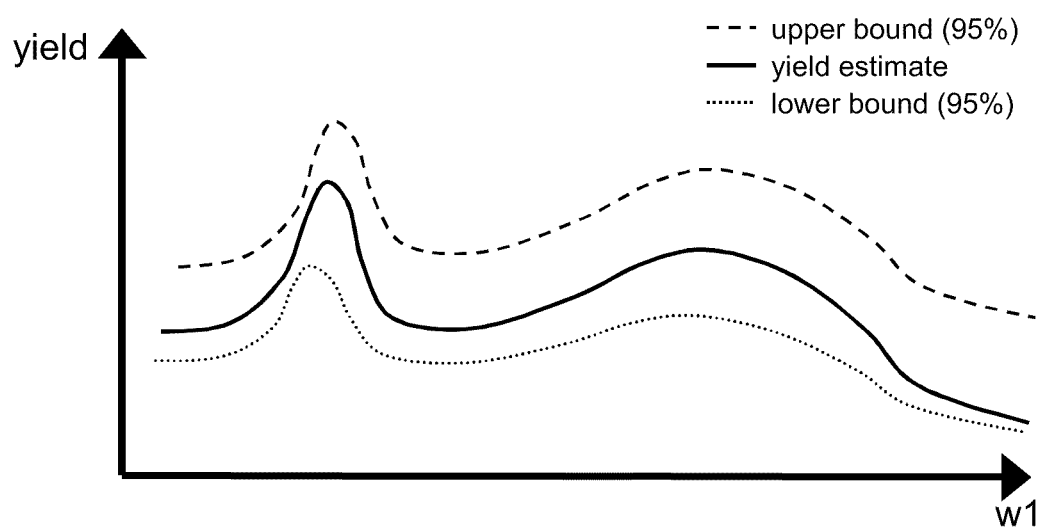
FIG. 4 shows an exemplary use of yield estimates when sweeping a design variable.

Another type of characteristic value that can be calculated by the processor module 24 is the output performances as a function of sweeping one variable through a range of values (and holding all other variables constant). A sweep of one design variable (e.g., the width of a device of the ECD in question) on just one environmental point and one random point is quite straightforward because raw simulation data can be shown directly (with as much certainty as that provided by the simulation module). However, it gets more complex once one wishes to account for the environmental and random effects at a given design (e.g., measure yield). There are limitations to the data available in which to aggregate across whole regions of random variable and/or environmental variable space; there are many possible methods to calculate something as yield for a sweep of a design variable, but they all have non-negligible uncertainties because of the limited number of possible simulations. If a user were to view yield as a function of design variables, if there is no indication of uncertainty, he may jump to false conclusions, for example think that changing a design variable to a new value will improve his yield by a certain amount. This can be mitigated by using confidence intervals for the yield estimates, as shown at FIG. 4. As seen at FIG. 4, the confidence interval can have a varying amplitude depending on the value of W1.

Figures 5A, 5B:
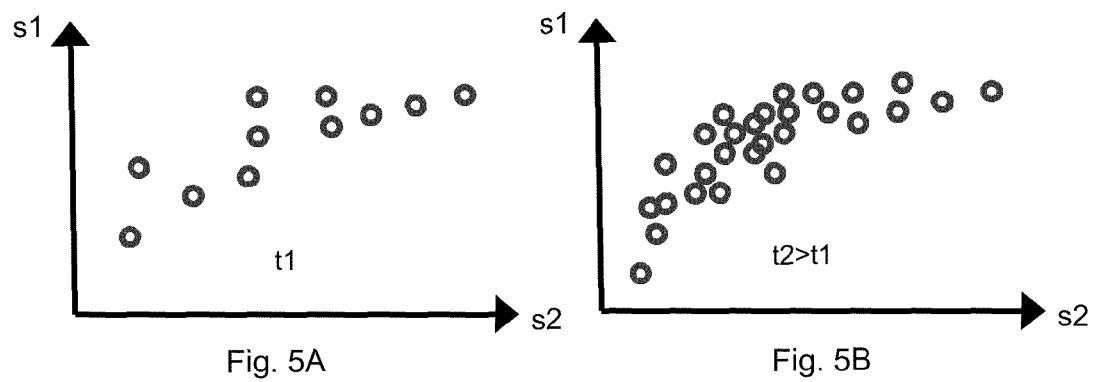
FIG. 5A shows an exemplary 2D scatter plot at time t1.
FIG. 5B shows the 2D scatter plot of FIG. 5A at time t2.
Figure 6A:
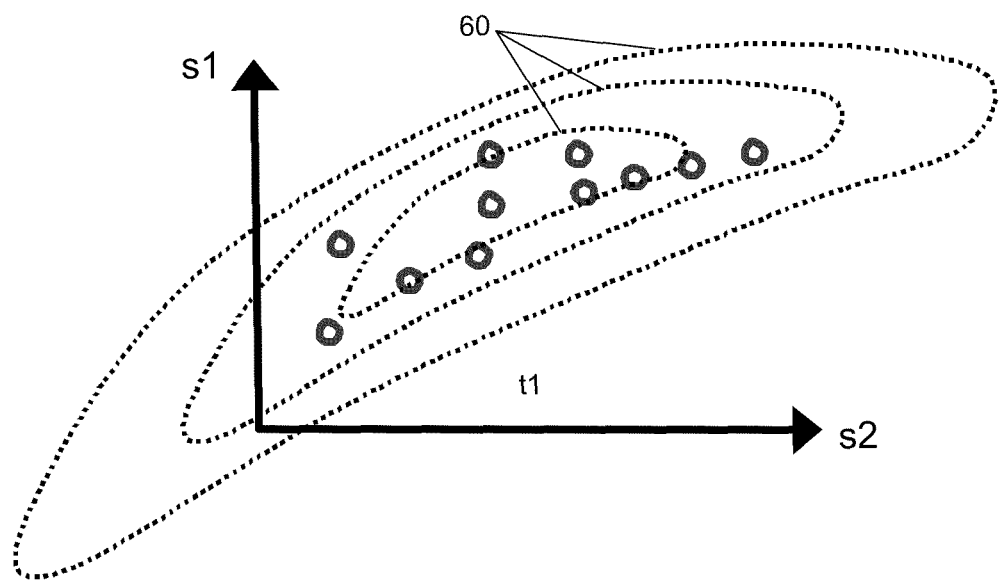
FIG. 6A shows the exemplary 2D scatter plot of FIG. 5A with contour plots used to show uncertainty in a density estimate.
Figure 6B:
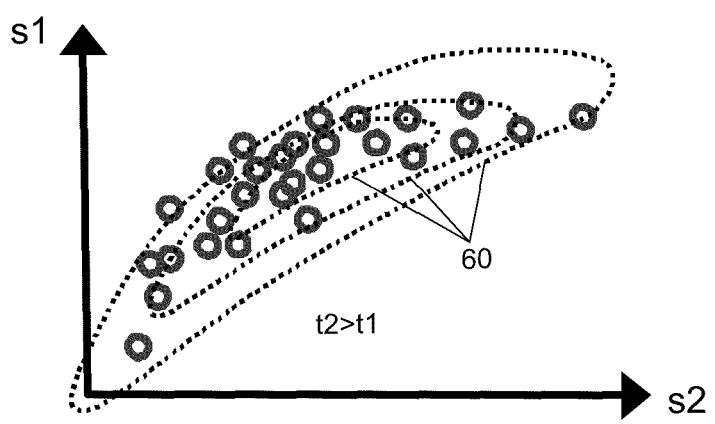
FIG. 6B shows the exemplary 2D scatter plot of FIG. 5B with contour plots used to show uncertainty in a density estimate.

As discussed above, confidence intervals can be used as a means of reporting statistical uncertainty to the user, so that he does not jump to premature conclusions about the data being presented. There are other means of reporting uncertainties whether it be in text reports such as p-values, or whether it be in a graphical format, such as showing a probability density function for one or more variables. FIGS. 5A and 5B show how to illustrate statistical uncertainty over simulation runtime. FIGS. 5A and 5B show 2D scatter plots performance metrics S1 and S2, where FIG. 5A has fewer samples than FIG. 5B, which is plotted after additional processing of data. If the user were to merely look at FIG. 5A, he may draw conclusions about the nature of the data that are too strong. When additional processing has been performed, more samples are presented at FIG. 5B and the true distribution underneath becomes apparent. Specifically, the curvature becomes apparent, whereas it is not apparent at FIG. 5A. Therefore one does not want to read too much into the data. FIGS. 6A and 6B shows the same 2D scatter plots FIGS. 5A and 5B, but this time with contour diagrams 60 overlaid to illustrate density estimates. The density estimate of the scatter plot of FIG. 6A is broader in range than that of FIG. 6B because there are fewer samples, which reflects its uncertainty. Therefore it is harder for the user to draw false conclusions from FIG. 6B than from FIG. 6A. Interestingly, one does not necessarily need contour plots because this uncertainty can be implicitly shown to the user via the time component.

Figure 7A:
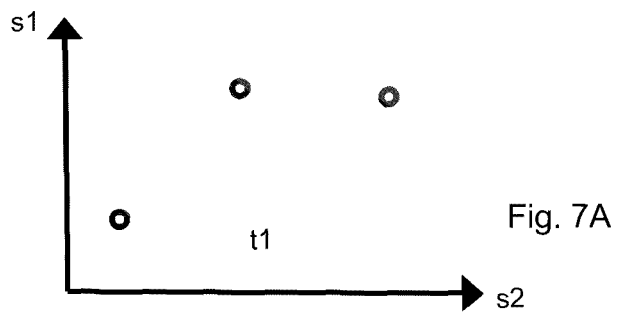
FIG. 7A shows an exemplary 2D scatter plot at time t1.
Figure 7B:
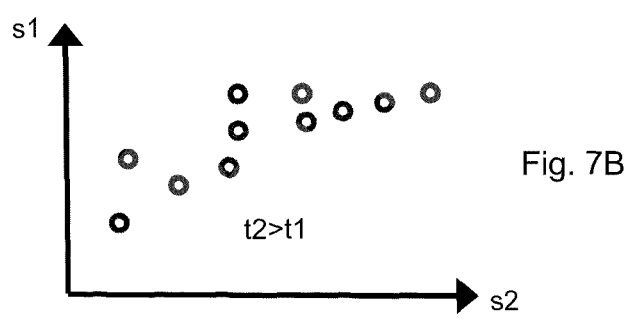
FIG. 7B shows an exemplary 2D scatter plot at time t2.
Figure 7C:
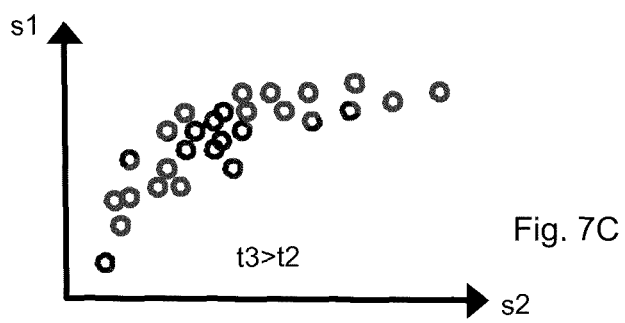
FIG. 7C shows an exemplary 2D scatter plot at time t3.

FIGS. 7A-7C show how dynamically updating the 2D scatter plots improves resolution as more processed data becomes available. FIGS. 7A-7C show how they provide greatly added value, especially when combined with means to display uncertainty. FIGS. 7A-7C show how 2D scatter plots fills in as time passes. The dynamic fill-in implicitly gives the user an intuitive feel of uncertainty, therefore having less reliance to show a density estimate plot (e.g., through contour plots overlaid). The advantage of this over non-dynamic contour plots is that it does not ask the user to understand how uncertainty is embedded in the effective breadth of the density estimates' contour plots. Of course, one could also dynamically update the density estimates and contour plots over time (not shown).

Figures 8A, 8B:
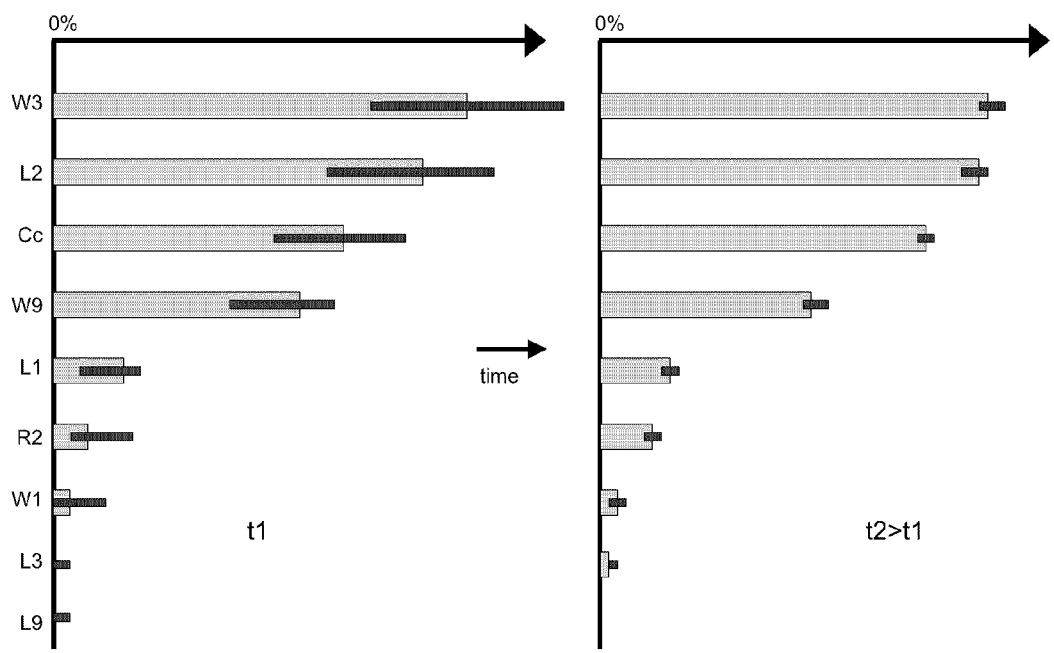
FIG. 8A shows exemplary confidence intervals at time t1.
FIG. 8B shows exemplary confidence intervals at time t2.

The confidence intervals of FIG. 3 can also be updated over time as shown at FIGS. 8A and 8B. These Figs. illustrate how confidence intervals of impact estimates tighten up as time passes. The estimated values (characteristic values) can change somewhat, but the user gets an increasingly good idea of what the most important variables are.

Figure 9:
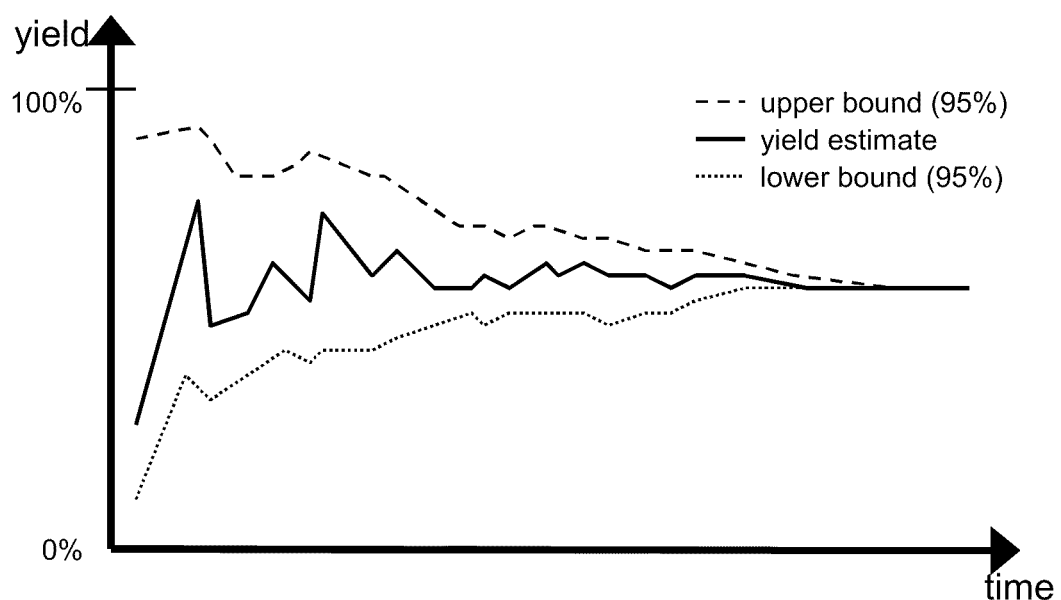
FIG. 9 shows how yield confidence intervals can tighten up as time passes.

FIG. 9 shows how the system and method of the present invention can be used to calculate and display a yield confidence interval, which tightens up as time passes.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A non-transitory, tangible computer-readable medium containing instructions, which when executed by a processor cause the processor to perform a method to analyze an electrical circuit design (ECD), the method comprising steps of:
    a) obtaining simulation data for multiple candidate designs of the ECD, the ECD having associated therewith at least one of circuit variables and circuit performance metrics;
    b) processing the simulation data in accordance with pre-determined rules to obtain characteristic data of the ECD and to determine a characteristic value of the ECD, the characteristic value of the ECD depending on the at least one of circuit variables and circuit performance metrics;
    c) processing the characteristic data of ECD to determine a statistical uncertainty of the characteristic value;
    d) determining if the statistical uncertainty of the characteristic value is outside a pre-determined range;
    e) only if the statistical uncertainty of the characteristic value is outside the pre-determined range, obtaining further simulation data for further candidate designs of the ECD to add to the simulation data and repeating steps (b) through (d); and,
    f) while steps (a) through (e) are performed, and when the characteristic value and the statistical uncertainty of the characteristic value have been determined, providing runtime feedback by displaying, for assessment of the ECD, the characteristic value and the statistical uncertainty of the characteristic value,
    displaying the characteristic value and the statistical uncertainty of the characteristic value including at least one of:
        plotting the characteristic value and a confidence interval of the characteristic value;
        plotting the characteristic value and a confidence interval of the characteristic value as a function of runtime;
        plotting the characteristic value and a statistical p-value of the characteristic value; and
        plotting a relative impact and a confidence interval of the relative impact of some of the circuit variables on a yield of the ECD.

2. The non-transitory, tangible computer-readable medium of claim 1 wherein:
    obtaining simulation data for multiple candidate designs of the ECD includes simulating multiple candidate designs of the ECD; and
    obtaining further simulation data of multiple candidate designs of the ECD includes further simulating multiple candidate designs of the ECD.

3. The non-transitory, tangible computer-readable medium of claim 1 wherein:
    obtaining simulation data for multiple candidate designs the ECD includes accessing a database containing the simulation data to extract the simulation data from the database; and
    obtaining further simulation data for multiple candidate designs of the ECD includes further accessing the database containing the simulation data to further extract simulation data from the database.

4. The non-transitory, tangible computer-readable medium of claim 1 wherein the circuit variables include at least one of design variables of the ECD, environmental variables of the ECD and process variables of the ECD.

5. The non-transitory, tangible computer-readable medium of claim 1 wherein the circuit performance metrics include at least a manufacturing yield of the ECD.

6. The non-transitory, tangible computer-readable medium of claim 2 wherein the step of simulating the ECD includes performing a SPICE simulation of the ECD to obtain SPICE-data and the step of processing the characteristic data of the ECD includes at least one of performing a sampling run of the SPICE-data and performing a characterization run of the SPICE-data.

7. The non-transitory, tangible computer-readable medium of claim 1 wherein the pre-determined rules include a pre-determined data-mining algorithm.

8. The non-transitory, tangible computer-readable medium of claim 1 wherein the pre-determined rules include a pre-determined model-building algorithm.

9. The non-transitory, tangible computer-readable medium of claim 1 wherein the pre-determined rules include a pre-determined statistical algorithm.

* * * * *